(12) United States Patent
Zhao

(10) Patent No.: US 11,749,189 B2
(45) Date of Patent: Sep. 5, 2023

(54) CHARGE SHARING CIRCUIT WITH TWO CLOCK SIGNAL GENERATION UNITS, CHARGE SHARING METHOD, DISPLAY DRIVING MODULE AND DISPLAY DEVICE

(71) Applicants: Beijing ESWIN Computing Technology Co., Ltd., Beijing (CN); Hefei ESWIN IC Technology Co., Ltd., Hefei (CN)

(72) Inventor: Xinjiang Zhao, Beijing (CN)

( * ) Notice: Subject to any disclaimer, the term of this patent is extended or adjusted under 35 U.S.C. 154(b) by 134 days.

(21) Appl. No.: 17/420,699

(22) PCT Filed: May 7, 2021

(86) PCT No.: PCT/CN2021/092101
§ 371 (c)(1),
(2) Date: Jul. 5, 2021

(87) PCT Pub. No.: WO2022/062415
PCT Pub. Date: Mar. 31, 2022

(65) Prior Publication Data
US 2022/0343840 A1 Oct. 27, 2022

(30) Foreign Application Priority Data
Sep. 28, 2020 (CN) .......................... 202011041981.6

(51) Int. Cl.
*G09G 3/36* (2006.01)
*G09G 3/3225* (2016.01)
(Continued)

(52) U.S. Cl.
CPC .......... *G09G 3/3225* (2013.01); *G09G 3/3674* (2013.01); *G11C 19/28* (2013.01);
(Continued)

(58) Field of Classification Search
CPC .. G09G 3/3208; G09G 3/3225; G09G 3/3266; G09G 3/36; G09G 3/3674;
(Continued)

(56) References Cited

U.S. PATENT DOCUMENTS

2008/0117157 A1* 5/2008 Hwang ................ G09G 3/3611
345/92
2008/0122829 A1 5/2008 Park
(Continued)

FOREIGN PATENT DOCUMENTS

CN 101187743 A 5/2008
CN 101221730 A 7/2008
(Continued)

OTHER PUBLICATIONS

Written Opinion of the International Search Authority corresponding to International Application No. PCT/CN2021/092101, dated Aug. 1, 2021 (12 pages).
(Continued)

*Primary Examiner* — Adam J Snyder

(57) ABSTRACT

A charge sharing circuit, a charge sharing method, a display driving module and a display device are provided. The charge sharing circuit includes a control unit and a switch unit. The control unit is electrically connected to first output control ends of two clock signal generation units, and configured to provide, when a first output module controls to not output a first voltage signal under the control of a first output control signal, an on control signal to the switch unit through a control signal output end. The switch unit is configured to control clock signal output ends of the two clock signal generation units to be electrically connected to each other under the control of the on control signal.

12 Claims, 3 Drawing Sheets

(51) Int. Cl.
*G11C 19/28* (2006.01)
*G09G 3/3266* (2016.01)
*G09G 3/3208* (2016.01)

(52) U.S. Cl.
CPC ......... *G09G 3/3208* (2013.01); *G09G 3/3266* (2013.01); *G09G 3/36* (2013.01); *G09G 2300/0426* (2013.01); *G09G 2300/0814* (2013.01); *G09G 2310/0264* (2013.01); *G09G 2310/0286* (2013.01); *G09G 2330/023* (2013.01)

(58) Field of Classification Search
CPC ... G09G 2300/0426; G09G 2300/0814; G09G 2310/0264; G09G 2310/0286; G09G 2330/023; G11C 19/28
See application file for complete search history.

(56) References Cited

U.S. PATENT DOCUMENTS

| | | | | |
|---|---|---|---|---|
| 2008/0278467 | A1* | 11/2008 | Hwang | G09G 3/3648 345/87 |
| 2009/0009497 | A1* | 1/2009 | Lee | G09G 3/3677 345/205 |
| 2010/0134172 | A1* | 6/2010 | Hsu | G09G 3/3611 327/296 |
| 2010/0220079 | A1* | 9/2010 | Bang | G09G 3/3696 345/204 |
| 2010/0245301 | A1 | 9/2010 | Shang | |
| 2010/0315322 | A1* | 12/2010 | Cheng | G09G 3/3611 345/99 |
| 2012/0032941 | A1* | 2/2012 | Chen | G09G 3/3677 345/212 |
| 2014/0210700 | A1* | 7/2014 | Won | G09G 3/3677 345/102 |
| 2014/0253418 | A1* | 9/2014 | Pyun | G09G 3/3677 327/109 |
| 2016/0211832 | A1 | 7/2016 | Moore et al. | |
| 2018/0137804 | A1* | 5/2018 | Choi | G09G 3/2092 |
| 2018/0301074 | A1 | 10/2018 | Shi | |

FOREIGN PATENT DOCUMENTS

| | | |
|---|---|---|
| CN | 101847377 A | 9/2010 |
| CN | 102956174 A | 3/2013 |
| CN | 104966503 A | 10/2015 |
| CN | 106531115 A | 3/2017 |
| CN | 106782287 A | 5/2017 |
| CN | 111145702 A | 5/2020 |
| CN | 112017613 A | 12/2020 |
| CN | 212516507 U | 2/2021 |

OTHER PUBLICATIONS

Machine Translation of Written Opinion of the International Search Authority corresponding to International Application No. PCT/CN2021/092101, dated Aug. 1, 2021 (2 pages).

* cited by examiner

CHARGE SHARING CIRCUIT WITH TWO CLOCK SIGNAL GENERATION UNITS, CHARGE SHARING METHOD, DISPLAY DRIVING MODULE AND DISPLAY DEVICE

CROSS-REFERENCE TO RELATED APPLICATION

This application is a U.S. national phase of PCT Application No. PCT/CN2021/092101 filed on May 7, 2021, which claims a priority of the Chinese patent application No. 202011041981.6 filed in China on Sep. 28, 2020, which is incorporated herein by reference in its entirety.

TECHNICAL FIELD

The present disclosure relates to the field of display technology, in particular to a charge sharing circuit, a charge sharing method, a display driving module and a display device.

BACKGROUND

In a display device, in order to save energy, gate charge sharing needs to be achieved between pixel circuits in different rows, and charges on a gate electrode of a to-be-turned-off transistor is transferred to a gate line for a to-be-turned-on transistor to reduce the power consumption for turning on the gate electrode.

In the display device, a gate driving signal applied to a gate electrode of a data write-in transistor of the pixel circuit is controlled by a clock signal provided by a corresponding clock signal generation circuit, so a sharing switch may be provided between clock signal output ends of different levels of clock signal generation units, so as to achieve the gate charge sharing between the data write-in transistors of the pixel circuits in different rows on a display panel.

In a charge sharing circuit of related art, a sharing signal is generated in accordance with a first clock signal and a second clock signal, then the sharing signal is translated to be within a negative voltage power source domain at a low voltage VGL through a level translation circuit, and then translated to be within a sharing switch power source domain through a level translation circuit, so as to control on and off states of the sharing switch. In the charge sharing circuit of the related art, a large quantity of level translation circuits are adopted, and a large area of a chip is occupied by these level translation circuits.

SUMMARY

A main object of the present disclosure is to provide a charge sharing circuit, a charge sharing method, a display driving module and a display device, so as to solve the problem in the related art where a large quantity of level translation circuits are adopted by the charge sharing circuit of the related art and a large area of a chip is occupied by these level translation circuits.

In one aspect, the present disclosure provides in some embodiments a charge sharing circuit for a display device, wherein the display device includes a gate driving circuit and a clock signal generation circuit, the gate driving circuit includes a plurality of levels of shift register units, the clock signal generation circuit includes at least two clock signal generation units, two clock signal generation units of the at least two clock signal generation circuits are configured to provide corresponding clock signals to two adjacent shift register units respectively, the clock signal generation unit includes a clock signal output end, a first output control end and a first output module, and the first output module is configured to control whether to output a first voltage signal through the clock signal output end under the control of a first output control signal outputted from the first output control end, wherein the charge sharing circuit includes a control unit and a switch unit;

the control unit is electrically connected to the first output control ends of the two clock signal generation units, and configured to provide, when the first output module does not output the first voltage signal under the control of the first output control signal, an on control signal to the switch unit through a control signal output end; and the switch unit is electrically connected to the control signal output end and the clock signal output ends of the two clock signal generation units, and configured to control the clock signal output ends of the two clock signal generation units to be electrically connected to each other under the control of the on control signal.

In a possible embodiment of the present disclosure, the switch unit includes a first switch transistor and a second switch transistor;

a control electrode of the first switch transistor and a control electrode of the second switch transistor are electrically connected to the control signal output end;

a first electrode of the first switch transistor is electrically connected to a clock signal output end of a first clock signal generation unit of the two clock signal generation units, a second electrode of the first switch transistor is electrically connected to a first electrode of the second switch transistor, and a second electrode of the second switch transistor is electrically connected to a clock signal output end of a second clock signal generation unit of the two clock signal generation units;

the first switch transistor and the second switch transistor are both p-type transistors, or the first switch transistor and the second switch transistor are both n-type transistors.

In a possible embodiment of the present disclosure, the first output module is configured to not output the first voltage signal through the clock signal output end when the first output control signal is a low voltage signal;

the control unit includes an NOR gate and a control module;

a first input end of the NOR gate is electrically connected to a first output control end of the first clock signal generation unit, and a second input end of the NOR gate is electrically connected to a first output control end of the second clock signal generation unit;

the control module is electrically connected to an output end of the NOR gate, and configured to control the first switch transistor and the second switch transistor to be turned on when the NOR gate outputs a high voltage signal through the output end of the NOR gate.

In a possible embodiment of the present disclosure, the first switch transistor and the second switch transistor are both the p-type transistors;

the control module includes a first level translation circuit and a first p-type driving circuit;

the first level translation circuit is electrically connected to the output end of the NOR gate, and the first level translation circuit is configured to translate a level of a signal outputted from the output end of the NOR gate to acquire a first control signal, and provide the first control signal to an input end of the first p-type driving circuit;

an output end of the first p-type driving circuit is electrically connected to the control signal output end, and the first p-type driving circuit is configured to invert a phase of the first control signal to acquire a second control signal, and output the second control signal to the control electrode of the first switch transistor through the control signal output end, to increase a driving capability of the output end of the first p-type driving circuit.

In a possible embodiment of the present disclosure, the first switch transistor and the second switch transistor are both the n-type transistors;

the control module includes a first level translation circuit and a first n-type driving circuit;

the first level translation circuit is electrically connected to the output end of the NOR gate, and the first level translation circuit is configured to translate a level of a signal outputted from the output end of the NOR gate to acquire a first control signal and provide the first control signal to an input end of the first n-type driving circuit;

an output end of the first n-type driving circuit is electrically connected to the control signal output end, and the first n-type driving circuit is configured to provide the first control signal to the control electrode of the first switch transistor through the control signal output end, to increase a driving capability of the output end of the first n-type driving circuit.

In a possible embodiment of the present disclosure, the first output module is configured to control, when the first output control signal is a high voltage signal, to not output the first voltage signal through the gate driving signal;

the control unit includes an NAND gate and a control module;

a first input end of the NAND gate is electrically connected to the first output control end of the first clock signal generation unit, a second input end of the NAND gate is electrically connected to the first output control end of the second clock signal generation unit;

the control module is electrically connected to an output end of the NAND gate, and configured to control the first switch transistor and the second switch transistor to be turned on when the NAND gate outputs a low voltage signal through the output end of the NAND gate.

In another aspect, the present disclosure provides in some embodiments a charge sharing method for the above-mentioned charge sharing circuit, including:

providing, by the control unit, the on control signal to the switch unit through the control signal output end, when the first output module controls to not output the first voltage signal under the control of the first output control signal; and controlling, by the switch unit, the clock signal output ends of the two clock signal generation units to be electrically connected to each other under the control of the on control signal.

In yet another aspect, the present disclosure provides in some embodiments a display driving module including a clock signal generation circuit and the above-mentioned charge sharing circuit.

In a possible embodiment of the present disclosure, the clock signal generation circuit includes a plurality of clock signal generation units;

the clock signal generation unit includes a clock signal output end, a first output control end, a second output control end, a first output module and a second output module;

the first output module is configured to control whether to output a first voltage signal through the clock signal output end under the control of a first output control signal outputted from the first output control end;

the second output module is configured to control whether to output a second voltage signal through the clock signal output end under the control of a second output control signal outputted from the second output control end.

In still yet another aspect, the present disclosure provides in some embodiments a display device including the above-mentioned display driving module.

According to the charge sharing circuit, the charge sharing method, the display driving module and the display device in the embodiments of the present disclosure, when the two clock signal generation units of the at least two clock signal generation units are controlled by the first output control ends of the two clock signal generation units to do not output the first voltage signal, the control unit may provide the on control signal to the switch unit, and the switch unit may control the clock signal output ends of the two clock signal generation units to be electrically connected to each other under the control of the on control signal. As a result, it is able to achieve the charge sharing, reduce the quantity of the adopted level translation circuits, and save a space of a chip.

DETAILED DESCRIPTION

Figure 1:
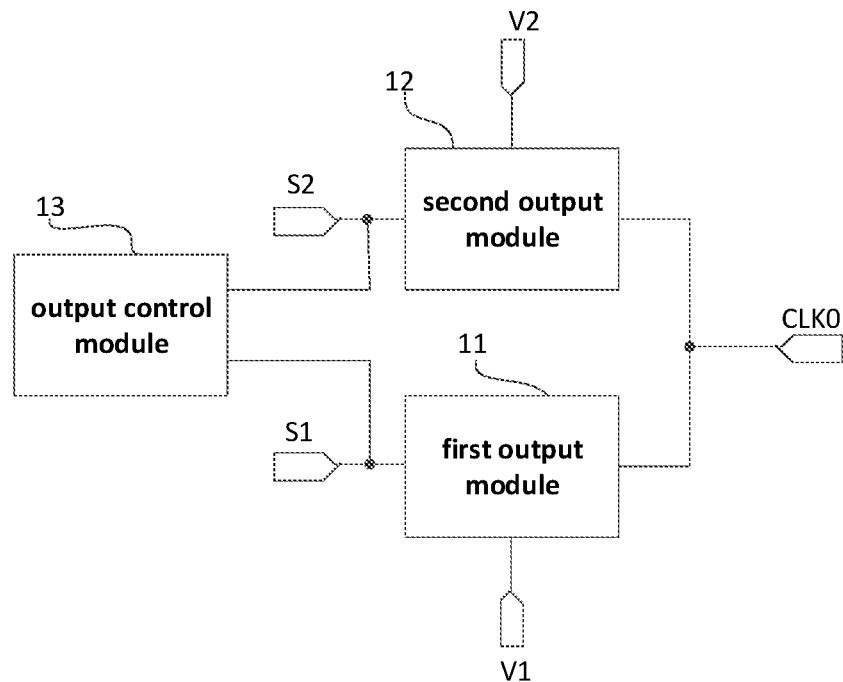
FIG. 1 is a structural view of a clock signal generation unit according to an embodiment of the present disclosure.

In the following the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be triodes, thin film transistors (TFT), field effect transistors (FETs) or any other elements having an identical characteristic. In the embodiments of the present disclosure, in order to differentiate two electrodes of the transistor other than a control electrode from each other, one of the two electrodes is called as first electrode and the other is called as second electrode.

In actual use, when the transistor is a triode, the control electrode may be a base electrode, the first electrode may be a collector and the second electrode may be an emitter, or the control electrode may be a base electrode, the first electrode may be an emitter and the second electrode may be a collector.

In actual use, when the transistor is a TFT or FET, the control electrode may be a gate electrode, the first electrode may be a drain electrode and the second electrode may be a source electrode, or the control electrode may be a gate electrode, the first electrode may be a source electrode and the second electrode may be a drain electrode.

The present disclosure provides in some embodiments a charge sharing circuit for a display device. The display device includes a gate driving circuit and a clock signal generation circuit, the gate driving circuit includes a plurality of shift register units, the clock signal generation circuit includes at least two clock signal generation units, and two clock signal generation units in the at least two clock signal generation units are configured to provide corresponding clock signals to two adjacent shift register units respectively. The clock signal generation unit includes a clock signal output end, a first output control end and a first output module, and the first output module is configured to control whether to output a first voltage signal through the clock signal output end under the control of a first output control signal outputted from the first output control end. The charge sharing circuit includes a control unit and a switch unit;

the control unit is electrically connected to the first output control ends of the two clock signal generation units, and configured to provide, when the first output module controls to not output the first voltage signal under the control of the first output control signal, an on control signal to the switch unit through a control signal output end;

the switch unit is electrically connected to the control signal output end and the clock signal output ends of the two clock signal generation units, and configured to control the clock signal output ends of the two clock signal generation units to be electrically connected to each other under the control of the on control signal.

During the operation of the charge sharing circuit in the embodiments of the present disclosure, the control unit may provide the on control signal to the switch unit when the two clock signal generation units do not output the first voltage signal through the first output control ends thereof, and the switch unit may control the clock signal output ends of the two clock signal generation units to be electrically connected to each other under the control of the on control signal, so as to achieve the charge sharing.

As compared with a charge sharing circuit of the related art, in the embodiments of the present disclosure, on and off states of the switch unit may be controlled through the first output control end rather than through translating a level of a sharing signal (the switch unit is a sharing unit for charge sharing). When the first output modules of the two clock signal generation units are controlled to do not output the first voltage signal, the switch unit may be controlled to be turned on, so as to achieve the electrical connection and the charge sharing between two clock signal generation units, reduce the quantity of level translation circuits, and save a space of a chip.

During the implementation, a display driving module in the embodiments of the present disclosure may include more than one charge sharing circuit, so as to achieve the charge sharing between number n of circuits (n is an integer greater than 1), so as to remarkably reduce the quantity of the level translation circuits in a better manner.

In the embodiments of the present disclosure, in a pixel circuit, when a data write-in transistor whose control electrode is electrically connected to a gate line is a p-type transistor, the first voltage signal may be a low voltage signal, and when the data write-in transistor whose control electrode is electrically connected to the gate line is an n-type transistor, the first voltage signal may be a high voltage signal. However, the present disclosure shall not be limited thereto.

In actual use, the control electrode of the data write-in transistor may be electrically connected to a corresponding gate line, and a first electrode of the data write-in transistor may be electrically connected to a corresponding data line. The data write-in transistor is configured to write a data voltage on the corresponding data line into a corresponding pixel circuit under the control of a gate driving signal on the corresponding gate line. However, the present disclosure shall not be limited thereto.

In the related art, the display device may include a display driving module, and the display driving module may include a gate driving circuit, a clock signal generation circuit and the charge sharing circuit. The gate driving circuit includes a plurality of levels of shift register units. The display device further includes a display panel, and the display panel includes a plurality of gate lines and a plurality of pixel circuits arranged in rows and columns. Each shift register unit in the gate driving circuit may provide a gate driving signal to a gate electrode of a transistor in a corresponding pixel circuit of the display panel through a corresponding gate line;

the clock signal generation circuit is configured to provide the gate driving signal to the gate driving circuit;

the clock signal generation circuit includes at least two clock signal generation units;

two clock signal generation units of the at least two clock signal generation units are configured to provide corresponding clock signals to two adjacent shift register units.

In the embodiments of the present disclosure, when the clock signal generation circuit includes two clock signal generation units, each odd-numbered-level shift register unit may be electrically connected to a clock signal output end of a first clock signal generation unit, and each even-numbered-level shift register units may be electrically connected to a clock signal output end of a second clock signal generation unit.

When the clock signal generation circuit includes four clock signal generation units, a $(4P-3)^{th}$-level shift register unit may be electrically connect to a clock signal output end of a first clock signal generation unit, a $(4P-2)^{th}$-level shift register unit may be electrically connect to a clock signal output end of a second clock signal generation unit, a $(4P-1)^{th}$-level shift register unit may be electrically connect to a clock signal output end of a third clock signal generation unit, and a $(4P)^{th}$-level shift register unit may be electrically connect to a clock signal output end of a fourth clock signal generation unit, where P is a positive integer.

In the display device, in order to save energy, gate charge sharing needs to be achieved between gate lines, and charges on a to-be-deenergized gate line is transferred to a to-be-energized gate line to reduce the power consumption for turning on the transistor in the display panel. In addition, a gate driving signal on the gate line is provided by a clock signal, so through the charge sharing between the clock signal output ends of the two clock signal generation units, it is able to achieve the charge sharing between gate electrodes of the transistors in the pixel circuits in different rows in the display panel.

In the embodiments of the present disclosure, during the charge sharing, the clock signal output end of the clock signal generation unit may be in a high impedance state.

As shown in FIG. 1, in a possible embodiment of the present disclosure, the clock signal generation unit includes a clock signal output end CLK0, a first output control end S1, a second output control end S2, a first output module 11, a second output module 12 and an output control module 13.

The first output module 11 is electrically connected to the first output control end S1, a first voltage end V1 and the clock signal output end CLK0, and configured to control the clock signal output end CLK0 to be electrically connected to, or electrically disconnected from, the first voltage end V1 under the control of a first output control signal outputted from the first output control end S1, and the first voltage end V1 is configured to provide a first voltage signal;

the second output module 12 is electrically connected to the second output control end S2, a second voltage end V2 and the clock signal output end CLK0, and configured to control the clock signal output end CLK0 to be electrically connected to, or electrically disconnected from, the second voltage end V2 under the control of a second output control signal outputted from the second output control end S2, and the second voltage end V2 is configured to provide a second voltage signal;

the output control module 13 is electrically connected to the first output control end S1 and the second output control end S2, and configured to provide the first output control signal to the first output control end S1 and provide the second output control signal to the second output control end S2.

In FIG. 1, the clock signal output end CLK0 being in a high impedance state means that: CLK0 is in the high impedance state when the first output module 11 controls the clock signal output end CLK0 to be electrically disconnected from the first voltage end V1 under the control of the first output control signal and the second output module 12 controls the clock signal output end CLK0 is electrically disconnected from the second voltage end V2 under the control of the second output control signal.

In the embodiments of the present disclosure, the first output module may include an n-type transistor, and the second output module may include a p-type transistor. However, the present disclosure shall not be limited thereto.

In actual use, alternatively, the first output module may include a p-type transistor, and the second output module may include an n-type transistor.

In the embodiments of the present disclosure, the gate driving circuit is configured to provide a gate driving signal to a pixel circuit;

in the pixel circuit, a data write-in transistor whose gate electrode is electrically connected to the gate driving signal output end may be an n-type transistor, the first voltage signal may be a low voltage signal, and the second voltage signal may be a high voltage signal; or the data write-in transistor may be a p-type transistor, the first voltage signal may be a high voltage signal and the second voltage signal may be a low voltage signal.

Figure 2:
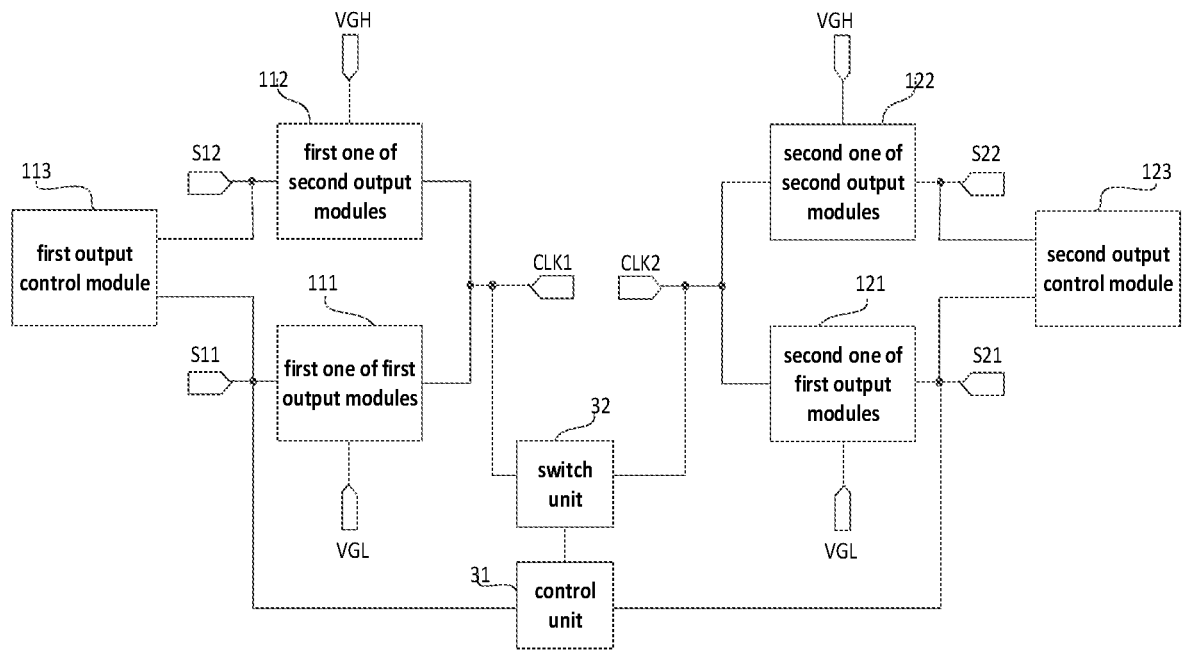
FIG. 2 is a structural view of a charge sharing circuit according to an embodiment of the present disclosure.

As shown in FIG. 2, the charge sharing circuit in the embodiments of the present disclosure is applied to a display device, the display device includes a clock signal generation circuit, and the clock signal generation circuit includes a first clock signal generation unit and a second clock signal generation unit, wherein the first clock signal generation unit includes a first clock signal output end CLK1, a first one S11 of first output control ends, a first one S12 of second output control ends, a first one 111 of first output modules, a first one 112 of second output modules, and a first output control module 113;

the first one 111 of first output modules is electrically connected to the first one S11 of first output control ends, a low voltage end and the first clock signal output end CLK1, and configured to control CLK1 to be electrically connected to, or electrically disconnected from, the low voltage end under the control of a first one of first output control signals from S11; the low voltage end is configured to provide a low voltage signal VGL, and the low voltage signal may be a direct-current voltage signal of −10V;

the first one 112 of second output modules is electrically connected to the first one S12 of second output control ends, a high voltage end and the first clock signal output end CLK1, and configured to control CLK1 to be electrically connected to, or electrically disconnected from, the high voltage end under the control of a first one of second output control signals from the first one S12 of second output control ends; the high voltage end is configured to provide a high voltage signal VGH, and the high voltage signal may be a direct-current voltage signal of 30V;

the first output control module 113 is electrically connected to S11 and S12, and configured to provide the first one of first output control signals to S11 and provide the first one of second output control signals to S12;

the second clock signal generation unit includes a second clock signal output end CLK2, a second one S21 of first output control ends, a second one S22 of second output control ends, a second one 121 of first output modules, a second one 122 of second output modules, and a second output control module 123;

the second one 121 of first output modules is electrically connected to the second one S21 of first output control ends, a low voltage end and the second clock signal output end CLK2, and configured to control CLK2 to be electrically connected to, or electrically disconnected from, the low voltage end under the control of a second one of first output control signals from S21; the low voltage end is configured to provide a low voltage signal, and the low voltage signal may be a direct-current voltage signal of −10V;

the second one 122 of second output modules is electrically connected to the second one S22 of second output control ends, a high voltage end and the second clock signal output end CLK2, and configured to control CLK2 to be electrically connected to, or electrically disconnected from, the high voltage end under the control of a second one of second output control signals from S22; the high voltage end is configured to provide a high voltage signal VGH, and the high voltage signal may be a direct-current voltage signal of 30V;

the second output control module 123 is electrically connected to S21 and S22, and configured to provide the second one of first output control signals to S21 and provide the second one of second output control signals to S22.

As shown in FIG. 2, the charge sharing circuit in the embodiments of the present disclosure includes a control unit 31 and a switch unit 32, wherein the control unit 31 is electrically connected to S11 and S21, and configured to provide an on control signal to the switch unit 32 through the control signal output end, when the first one 111 of first output modules does not output the low voltage signal through CLK1 under the control of the first one of first output control signals from S11, and the second one 121 of first output control modules does not output the low voltage signal through CLK2 under the control of the second one of first output control signals from S21;

the switch unit 32 is electrically connected to the control signal output end, CLK1 and CLK2, and configured to control CLK1 to be electrically connected to CLK2 under the control of the on control signal.

In the embodiments of the present disclosure, when each of CLK1 and CLK2 outputs the high voltage signal, the switch unit 32 may also control CLK1 to be electrically connected to CLK2. However, at this time, the pixel circuit is not adversely affected by the charge sharing, so a function of the entire system may not be adversely affected.

In a possible embodiment of the present disclosure, the switch unit may include a first switch transistor and a second switch transistor;

a control electrode of the first switch transistor and a control electrode of the second switch transistor may be electrically connected to the control signal output end;

a first electrode of the first switch transistor may be electrically connected to a clock signal output end of a first clock signal generation unit of the two clock signal generation units, a second electrode of the first switch transistor may be electrically connected to a first electrode of the second switch transistor, and a second electrode of the second switch transistor may be electrically connected to a clock signal output end of a second clock signal generation unit of the two clock signal generation units;

the first switch transistor and the second switch transistor may be both p-type transistors or both n-type transistors.

During the implementation, the first output module may not output the first voltage signal through the clock signal output end when the first output control signal is a low voltage signal;

the control unit may include an NOR gate and a control module;

a first input end of the NOR gate may be electrically connected to a first output control end of the first clock signal generation unit, and a second input end of the NOR gate may be electrically connected to a first output control end of the second clock signal generation unit;

the control module may be electrically connected to an output end of the NOR gate, and configured to control the first switch transistor and the second switch transistor to be turned on when the NOR gate outputs a high voltage signal through the output end thereof.

In a possible embodiment of the present disclosure, the first switch transistor and the second switch transistor may be both p-type transistors;

the control module may include a first level translation circuit and a first p-type driving circuit;

the first level translation circuit may be electrically connected to the output end of the NOR gate, and configured to translate a level of a signal outputted from the output end of the NOR gate to acquire a first control signal and provide the first control signal to the first p-type driving circuit;

an output end of the first p-type driving circuit may be electrically connected to the control signal output end, and the first p-type driving circuit is configured to invert a phase of the first control signal to acquire a second control signal and output the second control signal to the control electrode of the first switch transistor through the control signal output end to increase a driving capability of the output end of the first p-type driving circuit.

In actual use, the first switch transistor and the second switch transistor may be both p-type transistors. At this time, when a gate-to-source voltage of the first switch transistor is smaller than a threshold voltage of the first switch transistor and a gate-to-source voltage of the second switch transistor is smaller than a threshold voltage of the second switch transistor, the first switch transistor and the second switch transistor may be turned on.

In another possible embodiment of the present disclosure, the first switch transistor and the second switch transistor may be both n-type transistors;

the control module may include a first level translation circuit and a first n-type driving circuit;

the first level translation circuit may be electrically connected to the output end of the NOR gate, and configured to translate a level of a signal outputted from the output end of the NOR gate to acquire a first control signal and provide the first control signal to the first n-type driving circuit;

an output end of the first n-type driving circuit may be electrically connected to the control signal output end, and the first n-type driving circuit is configured to provide the first control signal to the control electrode of the first switch transistor through the control signal output end to increase a driving capability of the output end of the first n-type driving circuit.

In actual use, the first switch transistor and the second switch transistor may be both n-type transistors. At this time, when a gate-to-source voltage of the first switch transistor is greater than a threshold voltage of the first switch transistor and a gate-to-source voltage of the second switch transistor is greater than a threshold voltage of the second switch transistor, the first switch transistor and the second switch transistor may be turned on.

During the implementation, the first output module may control to do not output the first voltage signal through the clock signal output end when the first output control signal is a high voltage signal;

the control unit may include an NAND gate and a control module;

a first input end of the NAND gate may be electrically connected to the first output control end of the first clock signal generation unit, and a second input end of the NAND gate may be electrically connected to the first output control end of the second clock signal generation unit;

the control module may be electrically connected to an output end of the NAND gate, and configured to control the first switch transistor and the second switch transistor to be turned on when the NAND gate outputs a low voltage signal through the output end thereof.

In the embodiments of the present disclosure, when the first output transistor of the first output module is a p-type transistor and the first output control signal is a high voltage signal, the first voltage signal may be control to be not outputted through the clock signal output end. At this time, the control unit may include the NAND gate and the control module. When the NAND gate outputs a low voltage signal, the control module may control the first switch transistor and the second switch transistor to be turned on.

Figure 3:
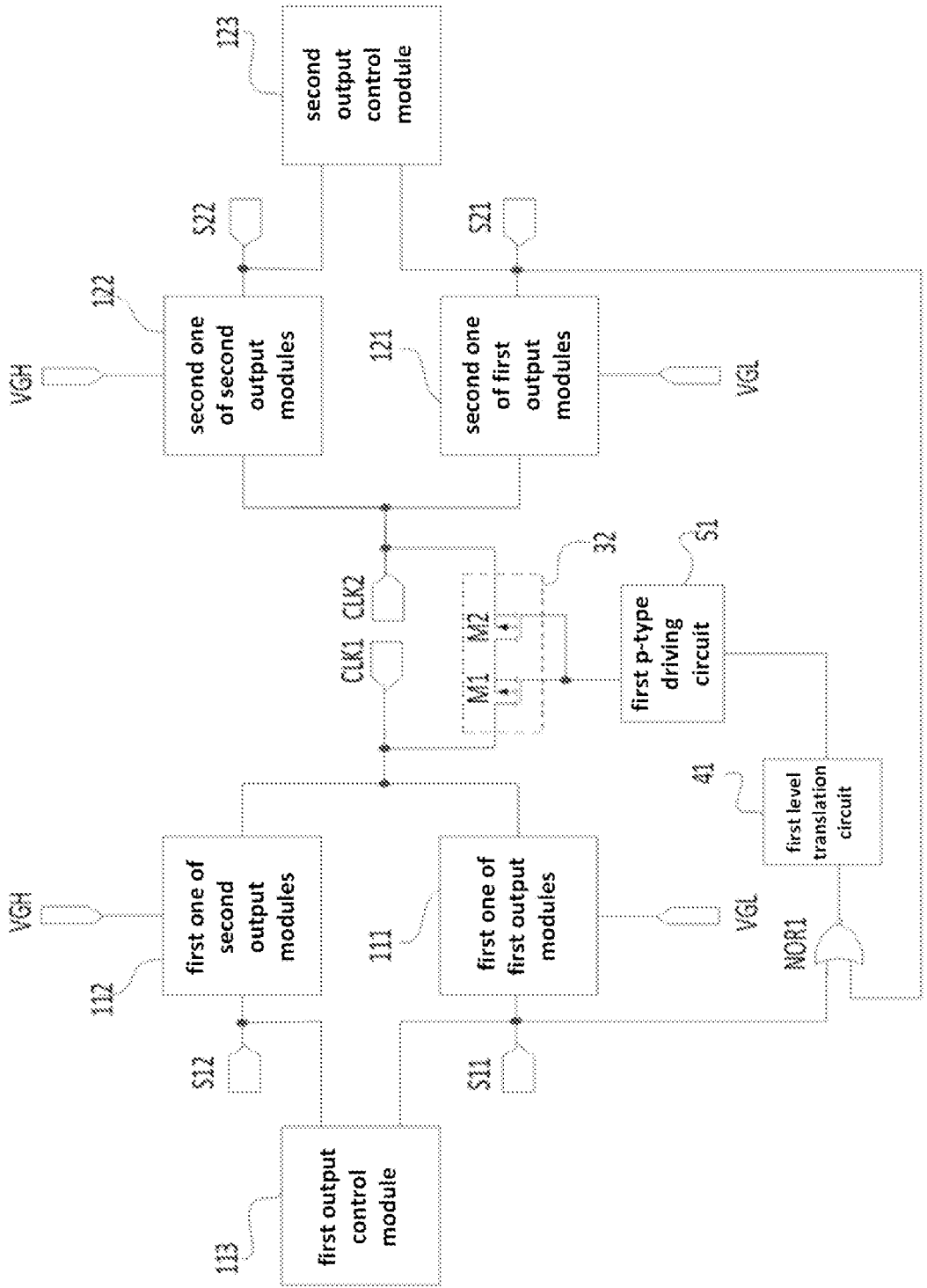
FIG. 3 is a circuit diagram of the charge sharing circuit according to another embodiment of the present disclosure.

As shown in FIG. 3, on the basis of the charge sharing circuit in FIG. 2, the switch unit 32 includes a first switch transistor M1 and a second switch transistor M2;

a gate electrode of the first switch transistor M1 and a gate electrode of the second switch transistor M2 are electrically connected to the control signal output end;

a drain electrode of the first switch transistor M1 is electrically connected to G1, a source electrode of the first switch transistor M1 is electrically connected to the drain electrode of M1, and a source electrode of the second switch transistor M1 is electrically connected to G2;

the first output transistor of the first one 111 of the first output modules and the first output transistor of the second one 121 of the first output modules are both n-type transistors;

the control unit includes a first NOR gate NOR1 and a control module;

a first input end of NOR1 is electrically connected to S11, and a second input end of NOR2 is electrically connected to S21;

the control module includes a first level translation circuit 41 and a first p-type driving circuit 50;

the first level translation circuit 41 is electrically connected to an output end of NOR1, and configured to translate a level of a signal outputted from the output end of NOR1 to acquire a first control signal, and provide the first control signal to the first p-type driving circuit 50;

the first p-type driving circuit 50 is configured to invert a phase of the first control signal to acquire a second control signal, and output the second control signal to the gate electrode of the first switch transistor M1 through the control signal output end.

In the embodiment of FIG. 3, each of M1 and M2 may be, but not limited to, an N-channel Metal Oxide Semiconductor (NMOS) transistor.

During the operation of the charge sharing circuit in FIG. 3, when each of S11 and S12 outputs a low voltage signal, NOR1 may output a first high voltage, the first level translation circuit 41 may translate a level of the first high voltage from NOR1 to generate a second high voltage greater than the first high voltage, and the first p-type driving circuit 50 may invert a phase of the second high voltage, so as to turn on M1 and M2, thereby to achieve the charge sharing.

Figure 4:
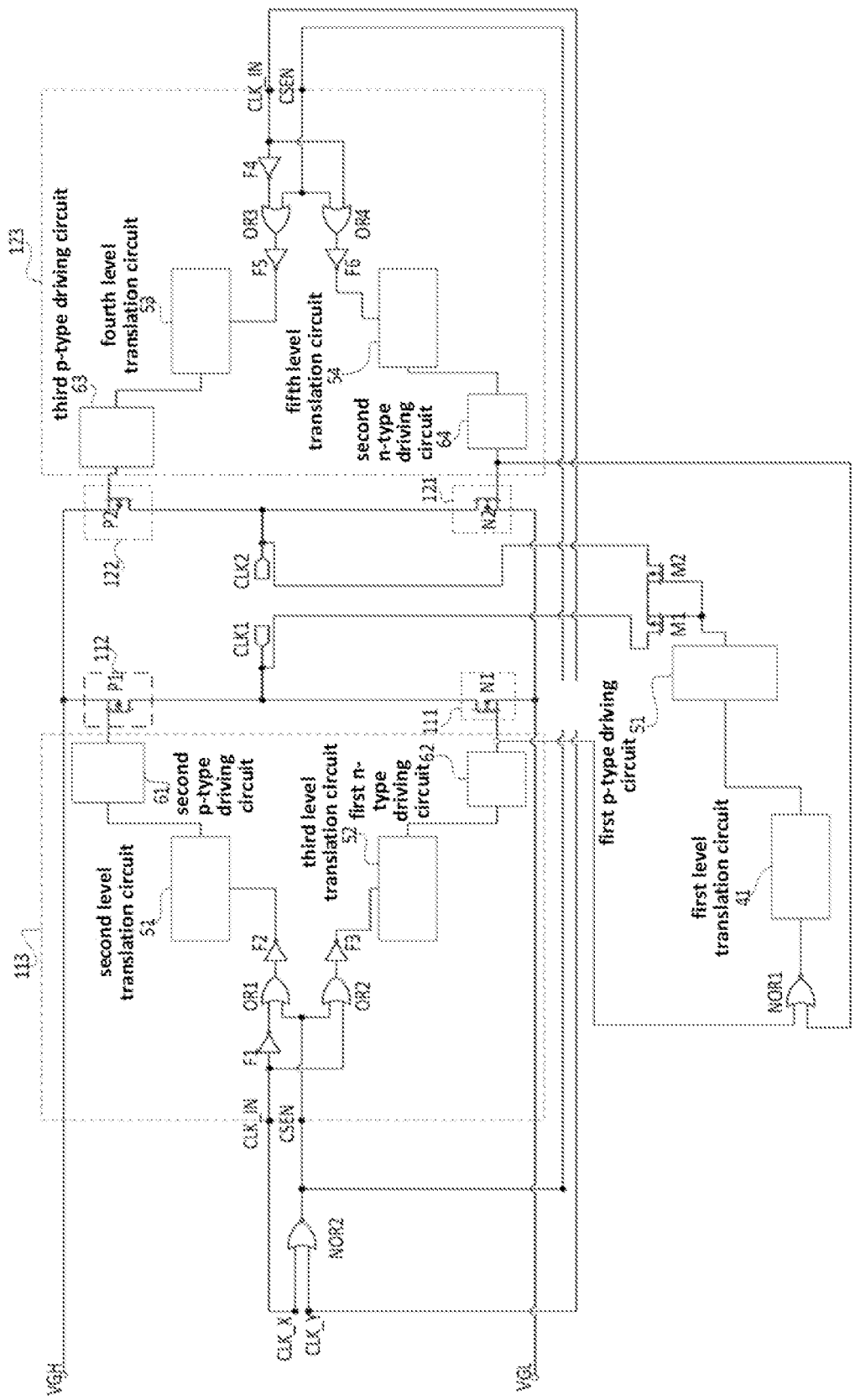
FIG. 4 is a circuit diagram of the charge sharing circuit according to another embodiment of the present disclosure.

As shown in FIG. 4, on the basis of the charge sharing circuit in FIG. 3, the first one 111 of first output modules includes a first output transistor N1, the first one 112 of second output modules includes a second output transistor P1, the second one 121 of first output modules includes a third output transistor N2, and the second one 122 of second output transistors includes a fourth output transistor P2;

the first output control module 113 includes a first phase inverter F1, a first OR gate OR1, a second OR gate OR2, a second phase inverter F2, a third phase inverter F3, a second level translation circuit 51, a third level translation circuit 52, a second p-type driving circuit 61 and a first n-type driving circuit 62;

an input end of F1 is configured to receive the input clock signal CLK_IN, an output end of F1 is electrically connected to a first input end of OR1, and a second input end of OR1 is configured to receive a sharing signal CSEN;

a first input end of OR2 is configured to receive CSEN, and a second input end of OR2 is configured to receive CLK_IN;

an input end of F2 is electrically connected to an output end of OR1, and an input end of F3 is electrically connected to an output end of OR2;

an output end of F2 is electrically connected to an input end of the second level translation circuit 51, and an output end of F3 is electrically connected to an input end of the third level translation circuit 52;

the second level translation circuit 51 is configured to translate a level of a voltage signal applied to its input end to acquire a third control signal, translate a level of the third control signal to be within a high voltage domain, and provide the third control signal to an input end of the second p-type driving circuit 61;

the third level translation circuit 52 is configured to translate a level of a voltage signal applied to its input end to acquire a fourth control signal, translate a level of the fourth control signal to be within a negative voltage domain, and provide the fourth control signal to an input end of the first n-type driving circuit 62;

an output end of the second p-type driving circuit 61 is electrically connected to a gate electrode of P1, and the second p-type driving circuit 61 is configured to provide the third control signal to the gate electrode of P1 to increase a driving capability of the output end of the second p-type driving circuit 61;

an output end of the first n-type driving circuit 62 is electrically connected to a gate electrode of N1, and the first n-type driving circuit 62 is configured to provide the fourth control signal to the gate electrode of N1 to increase a driving capability of the output end of the first n-type driving circuit 62.

The second output control module 123 includes a fourth phase inverter F4, a third OR gate OR3, a fourth OR gate OR4, a fifth phase inverter F5, a sixth phase inverter F6, a fourth level translation circuit 53, a fifth level translation circuit 54, a third p-type driving circuit 63 and a second n-type driving circuit 64;

an input end of F4 is configured to receive CLK_IN, an output end of F4 is electrically connected to a first input end of OR3, and a second input end of OR3 is configured to receive the sharing signal CSEN;

a first input end of OR4 is configured to receive CSEN, and a second input end of OR4 is configured to receive CLK_IN;

an input end of F5 is electrically connected to an output end of OR3, and an input end of F6 is electrically connected to an output end of OR4;

an output end of F5 is electrically connected to an input end of the fourth level translation circuit 53, and an output end of F6 is electrically connected to an input end of the fifth level translation circuit 54;

the fourth level translation circuit 53 is configured to translate a level of a voltage signal applied to its input end to acquire a fifth control signal, translate a level of the fifth control signal to be within a high voltage domain, and provide the fifth control signal to an input end of the third p-type driving circuit 63;

the fifth level translation circuit 54 is configured to translate a level of a voltage signal applied to its input end to acquire a sixth control signal, translate a level of the sixth control signal to be within a negative voltage domain, and provide the sixth control signal to an input end of the second n-type driving circuit 64.

an output end of the third p-type driving circuit 63 is electrically connected to a gate electrode of P2, and the third p-type driving circuit 63 is configured to provide the fifth control signal to the gate electrode of P2 to increase a driving capability of an output end of the third p-type driving circuit 63.

an output end of the second n-type driving circuit 64 is electrically connected to a gate electrode of N2, and the second n-type driving circuit 64 is configured to provide the sixth control signal to the gate electrode of N2 to increase a driving capability of an output end of the second n-type driving circuit 64.

In FIG. 4, NOR2 represents the second NOR gate, a first input end of NOR2 is configured to receive a first clock signal CLK_X, a second input end of NOR2 is configured to receive a second clock signal CLK_Y, and an output of NOR2 is configured to output CSEN.

In FIG. 4, a level of the sharing signal CSEN may be within a range of 0V to 5V, the high voltage domain may be 25V to 30V, and the negative voltage domain may be −10V to −5V. The level of the voltage signal applied to the input end of the second level translation circuit 51, the level of the voltage signal applied to the input end of the third level translation circuit 52, the level of the voltage signal applied to the input end of the fourth level translation circuit 53, and the level of the voltage signal applied to the input end of the fifth level translation circuit 54 may each be switched between 0V and 5V. Hence, the level of the third control signal and the level of the fifth control signal may each be switched between 25V and 30V, and the level of the fourth control signal and the level of the sixth control signal may be switched between −10V and −5V.

The present disclosure further provides in some embodiments a charge sharing method for the above-mentioned charge sharing circuit, which includes:

providing, by the control unit, the on control signal to the switch unit through the control signal output end, when the first output module controls to not output the first voltage signal under the control of the first output control signal; and controlling, by the switch unit, the clock signal output ends of the two clock signal generation units to be electrically connected to each other under the control of the on control signal.

During the operation of the charge sharing circuit in the embodiments of the present disclosure, the control unit may provide the on control signal to the switch unit when two clock signal generation units of the at least two clock signal generation units do not output the first voltage signal under the control of the first output control ends thereof, and the switch unit may control the clock signal output ends of the two clock signal generation units to be electrically connected to each other under the control of the on control signal, so as to achieve the charge sharing.

The present disclosure further provides in some embodiments a display diving module, which includes a clock signal generation circuit and the above-mentioned charge sharing circuit.

In the embodiments of the present disclosure, the clock signal generation circuit may include a plurality of clock signal generation units;

the clock signal generation unit comprises a clock signal output end, a first output control end, a second output control end, a first output module and a second output module;

the first output module is configured to control whether to output the first voltage signal through the clock signal output end under the control of a first output control signal outputted from the first output control end;

the second output module is configured to control whether to output the second voltage signal through the clock signal output end under the control of the second output control signal outputted from the second output control end.

The present disclosure further provides in some embodiments a display device including the above-mentioned display driving module.

In the embodiments of the present disclosure, the display device may be, but not limited to, a liquid crystal display device. In actual use, the display device may also be an organic light-emitting diode (OLED) display device.

The display device in the embodiments of the present disclosure may be any product or member having a display function, e.g., mobile phone, tablet computer, television, display, laptop computer, digital photo frame or navigator.

The above are optional embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A charge sharing circuit for a display device, wherein the display device comprises a gate driving circuit and a clock signal generation circuit, the gate driving circuit comprising a plurality of levels of shift register units, the clock signal generation circuit comprising at least two clock signal generation units configured to provide corresponding clock signals to two adjacent shift register units respectively, each of the clock signal generation units comprising a clock signal output end, a first output control end and a first output module, the first output module configured to control whether to output a first voltage signal through the clock signal output end under the control of a first output control signal outputted from the first output control end, the charge sharing circuit comprising:

a control unit; and
a switch unit; and
wherein,
the control unit is electrically connected to the first output control ends of the two clock signal generation units, and configured to provide, when the first output module controls to not output the first voltage signal under the control of the first output control signal, an on control signal to the switch unit through a control signal output end; and
the switch unit is electrically connected to the control signal output end and the clock signal output ends of the two clock signal generation units, and configured to control the clock signal output ends of the two clock signal generation units to be electrically connected to each other under the control of the on control signal, wherein:
the switch unit comprises a first switch transistor and a second switch transistor;
a control electrode of the first switch transistor and a control electrode of the second switch transistor are electrically connected to the control signal output end;
a first electrode of the first switch transistor is electrically connected to a clock signal output end of a first clock signal generation unit of the two clock signal generation units, a second electrode of the first switch transistor is electrically connected to a first electrode of the second switch transistor, and a second electrode of the second switch transistor is electrically connected to a clock signal output end of a second clock signal generation unit of the two clock signal generation units; and
the first switch transistor and the second switch transistor are p-type transistors, or the first switch transistor and the second switch transistor are n-type transistors, wherein:
the first output module is configured to control to not output the first voltage signal through the clock signal output end when the first output control signal is a low voltage signal;
the control unit comprises a NOR gate and a control module;
a first input end of the NOR gate is electrically connected to the first output control end of the first clock signal generation unit, and a second input end of the NOR gate is electrically connected to the first output control end of the second clock signal generation unit; and
the control module is electrically connected to an output end of the NOR gate, and configured to control the first switch transistor and the second switch transistor to be turned on when the NOR gate outputs a high voltage signal through the output end of the NOR gate.

2. The charge sharing circuit according to claim 1, wherein:

the first switch transistor and the second switch transistor are p-type transistors;
the control module comprises a first level translation circuit and a first p-type driving circuit; and
the first level translation circuit is electrically connected to the output end of the NOR gate, and the first level translation circuit is configured to translate a level of a signal outputted from the output end of the NOR gate to acquire a first control signal, and provide the first control signal to an input end of the first p-type driving circuit; and an output end of the first p-type driving circuit is electrically connected to the control signal output end, and the first p-type driving circuit is configured to invert a phase of the first control signal to acquire a second control signal, and output the second control signal to the control electrode of the first switch transistor through the control signal output end, to increase a driving capability of the output end of the first p-type driving circuit.

3. The charge sharing circuit according to claim 1, wherein:

the first switch transistor and the second switch transistor are n-type transistors;

the control module comprises a first level translation circuit and a first n-type driving circuit;

the first level translation circuit is electrically connected to the output end of the NOR gate, and the first level translation circuit is configured to translate a level of a signal outputted from the output end of the NOR gate to acquire a first control signal and provide the first control signal to an input end of the first n-type driving circuit; and an output end of the first n-type driving circuit is electrically connected to the control signal output end, and the first n-type driving circuit is configured to provide the first control signal to the control electrode of the first switch transistor through the control signal output end, to increase a driving capability of the output end of the first n-type driving circuit.

4. A charge sharing method for the charge sharing circuit according to claim 1, comprising:

providing, by the control unit, the on control signal to the switch unit through the control signal output end, when the first output module controls to not output the first voltage signal under the control of the first output control signal; and controlling, by the switch unit, the clock signal output ends of the two clock signal generation units to be electrically connected to each other under the control of the on control signal.

5. A display driving module, comprising a clock signal generation circuit and the charge sharing circuit according to claim 1.

6. The display driving module according to claim 5, wherein:

the clock signal generation circuit comprises a plurality of clock signal generation units;

at least a first of the plurality of clock signal generation units comprises a clock signal output end, a first output control end, a second output control end, a first output module and a second output module;

the first output module is configured to control whether to output the first voltage signal through the clock signal output end under the control of a first output control signal outputted from the first output control end; and the second output module is configured to control whether to output the second voltage signal through the clock signal output end under the control of the second output control signal outputted from the second output control end.

7. A display device, comprising the display driving module according to claim 5.

8. The display driving module according to claim 5, wherein:

the first switch transistor and the second switch transistor are p-type transistors;

the control module comprises a first level translation circuit and a first p-type driving circuit;

the first level translation circuit is electrically connected to the output end of the NOR gate, and the first level translation circuit is configured to translate a level of a signal outputted from the output end of the NOR gate to acquire a first control signal, and provide the first control signal to an input end of the first p-type driving circuit; and an output end of the first p-type driving circuit is electrically connected to the control signal output end, and the first p-type driving circuit is configured to invert a phase of the first control signal to acquire a second control signal, and output the second control signal to the control electrode of the first switch transistor through the control signal output end, to increase a driving capability of the output end of the first p-type driving circuit.

9. The display driving module according to claim 8, wherein:

the clock signal generation circuit comprises a plurality of clock signal generation units;

at least a first of the clock signal generation unit comprises a clock signal output end, a first output control end, a second output control end, a first output module and a second output module;

the first output module is configured to control whether to output the first voltage signal through the clock signal output end under the control of a first output control signal outputted from the first output control end; and the second output module is configured to control whether to output the second voltage signal through the clock signal output end under the control of the second output control signal outputted from the second output control end.

10. The display driving module according to claim 5, wherein:

the first switch transistor and the second switch transistor are n-type transistors;

the control module comprises a first level translation circuit and a first n-type driving circuit;

the first level translation circuit is electrically connected to the output end of the NOR gate, and the first level translation circuit is configured to translate a level of a signal outputted from the output end of the NOR gate to acquire a first control signal and provide the first control signal to an input end of the first n-type driving circuit; and an output end of the first n-type driving circuit is electrically connected to the control signal output end, and the first n-type driving circuit is configured to provide the first control signal to the control electrode of the first switch transistor through the control signal output end, to increase a driving capability of the output end of the first n-type driving circuit.

11. The display driving module according to claim 10, wherein:

the clock signal generation circuit comprises a plurality of clock signal generation units;

at least a first of the clock signal generation unit comprises a clock signal output end, a first output control end, a second output control end, a first output module and a second output module;

the first output module is configured to control whether to output the first voltage signal through the clock signal output end under the control of a first output control signal outputted from the first output control end; and the second output module is configured to control whether to output the second voltage signal through the clock signal output end under the control of the second output control signal outputted from the second output control end.

12. A charge sharing circuit for a display device, wherein the display device comprises a gate driving circuit and a clock signal generation circuit, the gate driving circuit comprising a plurality of levels of shift register units, the clock signal generation circuit comprising at least two clock signal generation units configured to provide corresponding clock signals to two adjacent shift register units respectively, each of the clock signal generation units comprising a clock signal output end, a first output control end and a first output module, the first output module configured to control whether to output a first voltage signal through the clock signal output end under the control of a first output control signal outputted from the first output control end, the charge sharing circuit comprising:

a control unit; and
a switch unit; and
wherein, the control unit is electrically connected to the first output control ends of the two clock signal generation units, and configured to provide, when the first output module controls to not output the first voltage signal under the control of the first output control signal, an on control signal to the switch unit through a control signal output end; and the switch unit is electrically connected to the control signal output end and the clock signal output ends of the two clock signal generation units, and configured to control the clock signal output ends of the two clock signal generation units to be electrically connected to each other under the control of the on control signal, wherein:

the switch unit comprises a first switch transistor and a second switch transistor;

a control electrode of the first switch transistor and a control electrode of the second switch transistor are electrically connected to the control signal output end;

a first electrode of the first switch transistor is electrically connected to a clock signal output end of a first clock signal generation unit of the two clock signal generation units, a second electrode of the first switch transistor is electrically connected to a first electrode of the second switch transistor, and a second electrode of the second switch transistor is electrically connected to a clock signal output end of a second clock signal generation unit of the two clock signal generation units; and the first switch transistor and the second switch transistor are p-type transistors, or the first switch transistor and the second switch transistor are n-type transistors, wherein:

the first output module is configured to control, when the first output control signal is a high voltage signal, to not output the first voltage signal through the gate driving signal;

the control unit comprises a NAND gate and a control module;

a first input end of the NAND gate is electrically connected to the first output control end of the first clock signal generation unit, a second input end of the NAND gate is electrically connected to the first output control end of the second clock signal generation unit; and the control module is electrically connected to an output end of the NAND gate, and configured to control the first switch transistor and the second switch transistor to be turned on when the NAND gate outputs a low voltage signal through the output end of the NAND gate.

* * * * *